(12) United States Patent
Horio et al.

(10) Patent No.: US 9,305,910 B2
(45) Date of Patent: Apr. 5, 2016

(54) SEMICONDUCTOR DEVICE

(71) Applicant: FUJI ELECTRIC CO., LTD., Kawasaki-shi, Kanagawa (JP)

(72) Inventors: Masafumi Horio, Matsumoto (JP); Kyohei Fukuda, Matsumoto (JP); Motohito Hori, Matsumoto (JP); Yoshinari Ikeda, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/706,601

(22) Filed: May 7, 2015

(65) Prior Publication Data

US 2015/0243640 A1    Aug. 27, 2015

Related U.S. Application Data

(63) Continuation of application No. 14/368,432, filed as application No. PCT/JP2012/083529 on Dec. 25, 2012, now Pat. No. 9,059,009.

(30) Foreign Application Priority Data

Feb. 9, 2012    (JP) .................................. 2012-026340

(51) Int. Cl.
    *H01L 23/48*    (2006.01)
    *H01L 23/02*    (2006.01)
    (Continued)

(52) U.S. Cl.
    CPC ............ *H01L 25/18* (2013.01); *H01L 23/3107* (2013.01); *H01L 23/3735* (2013.01);
    (Continued)

(58) Field of Classification Search
    CPC .................... H01L 24/49; H01L 2924/30107; H01L 23/5385; H01L 23/49811
    USPC ................... 257/697, 723, 698, 686, E23.079
    See application file for complete search history.

(56) References Cited

U.S. PATENT DOCUMENTS 5,130,768 A * 7/1992 Wu ...................... H01L 23/4006
                                                     257/712
5,138,438 A * 8/1992 Masayuki ................ G11C 5/00
                                                     174/541

(Continued)

FOREIGN PATENT DOCUMENTS

DE        10333315 A1    3/2005
JP     2001-274322 A    10/2001

(Continued)

OTHER PUBLICATIONS

PCT, "International Search Report for International Application No. PCT/JP2012/083529" from Parent Application of U.S. Appl. No. 14/368,432.

(Continued)

*Primary Examiner* — Nitin Parekh
(74) *Attorney, Agent, or Firm* — Manabu Kanesaka

(57) ABSTRACT

A semiconductor device includes an insulating substrate having a first conductive pattern on a first insulating substrate; a first semiconductor element having one surface fixed to the first conductive pattern; a printed circuit board having a conductive layer on a second insulating substrate and a plurality of metal pins fixed to the conductive layer; and a third insulating substrate. A portion of pins constituting the metal pins is fixed to other surface of the first semiconductor element, and the printed circuit board with the metal pins is sandwiched between the insulating substrate having the first conductive pattern and the third insulating substrate.

5 Claims, 16 Drawing Sheets

(51) Int. Cl.
*H01L 25/18* (2006.01)
*H01L 23/538* (2006.01)
*H01L 25/07* (2006.01)
*H01L 23/00* (2006.01)
*H01L 25/065* (2006.01)
*H01L 23/373* (2006.01)
*H01L 23/498* (2006.01)
*H01L 23/433* (2006.01)
*H01L 23/31* (2006.01)

(52) U.S. Cl.
CPC ...... *H01L23/49838* (2013.01); *H01L 23/5385* (2013.01); *H01L 24/01* (2013.01); *H01L 24/49* (2013.01); *H01L 25/0655* (2013.01); *H01L 25/072* (2013.01); *H01L 25/074* (2013.01); *H01L 23/3121* (2013.01); *H01L 23/4334* (2013.01); *H01L 23/49811* (2013.01); *H01L 23/49844* (2013.01); *H01L 2224/32225* (2013.01); *H01L 2224/48091* (2013.01); *H01L 2224/48137* (2013.01); *H01L 2224/48139* (2013.01); *H01L 2224/48227* (2013.01); *H01L 2224/4912* (2013.01); *H01L 2224/73265* (2013.01); *H01L 2924/00014* (2013.01); *H01L 2924/12032* (2013.01); *H01L 2924/12036* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/15787* (2013.01); *H01L 2924/30107* (2013.01)

(56) References Cited

U.S. PATENT DOCUMENTS 5,479,319 A * 12/1995 Werther ............... H05K 3/3415
  174/260
5,608,265 A * 3/1997 Kitano ................ H01L 21/565
  257/685
5,613,033 A * 3/1997 Swamy ............ H01L 23/49827
  257/E23.067
5,781,415 A * 7/1998 Itoh ...................... H01L 25/105
  174/50.51
5,994,166 A * 11/1999 Akram .................. H05K 1/144
  257/686
6,188,127 B1* 2/2001 Senba .................. H01L 21/563
  257/685
7,656,031 B2* 2/2010 Chen ................ H01L 23/49811
  257/690
2007/0215903 A1 9/2007 Sakamoto et al.
2007/0222054 A1* 9/2007 Hembree ............. B23K 20/004
  257/686
2008/0290508 A1* 11/2008 Sukegawa ............... H01L 23/48
  257/724
2009/0278246 A1* 11/2009 Hoshino ............. H01L 21/6835
  257/686
2010/0054758 A1* 3/2010 Ereifej ................ H04B 10/296
  398/202

FOREIGN PATENT DOCUMENTS

| JP | 2004-172211 A | 6/2004 |
| JP | 2004-214452 A | 7/2004 |
| JP | 2005-026524 A | 1/2005 |
| JP | 2005-216876 A | 8/2005 |
| JP | 2009-064852 A | 3/2009 |
| JP | 2009-141288 A | 6/2009 |
| JP | 2011-023570 A | 2/2011 |

OTHER PUBLICATIONS

Europe Patent Office, "Search Report for EP 12868019.6," Sep. 15, 2015.

* cited by examiner

US 9,305,910 B2

SEMICONDUCTOR DEVICE

CROSS-REFERENCE TO RELATED APPLICATIONS

The present application is a continuation application of U.S. Ser. No. 14/368,432, filed on Jun. 24, 2014, which is a National Stage of PCT/JP2012/083529 filed Dec. 25, 2012, which claims priority from Japanese patent application No. 2012-026340 filed on Feb. 9, 2012.

TECHNICAL FIELD

The present invention relates to a semiconductor device such as a semiconductor module.

BACKGROUND ART

A conventional semiconductor device is now explained using FIG. 16 which is a cross-sectional diagram showing substantial parts of the semiconductor device. A 2-in-1 semiconductor module 500 is shown in FIG. 16 as an example of the semiconductor device. In the diagram, reference numeral 101 represents a heat dissipation metal base plate. Reference numeral 102 represents an insulating substrate with conductive patterns (ceramic insulating substrate) that is placed on and joined to the metal base plate 101 by solder 103. This insulating substrate with conductive patterns (ceramic insulating substrate) 102 is formed by laminating a conductive pattern 102b on a front surface of an insulating substrate (ceramic substrate) 102a and a back-surface conductive film 102c on a rear surface of the same (i.e., the metal patterns 102b and 102c are laminated on the front and rear surfaces of the insulating substrate 102a). Reference numeral 104 represents semiconductor chips (semiconductor power chips) that are mounted on the conductive pattern 102b of the insulating substrate with conductive patterns 102 by solder 105. Reference numeral 106 represents a resin case for accommodating a cooling base (the metal base plate) 101 that is joined to the back-surface conductive film 102c of the insulating substrate with conductive patterns (ceramic insulating substrate) 102 by the solder 103. Reference numeral 107 represents metal bar terminals, which are external lead terminals, joined to the conductive pattern 102b by the solder 105. Bonding wires 108 are used to join the semiconductor chips 104 to each other or one of the semiconductor chips 104 to the conductive pattern 102b in another area.

Patent Document 1 discloses a semiconductor device in which semiconductor chips are disposed on an insulating substrate with conductive patterns, and a plurality of metal pins that is fixed to the semiconductor chips and the conductive patterns are fixed to a printed circuit board. In this semiconductor device, wiring inductances can be reduced by disposing metal foil pieces, which are laminated on the front and rear surfaces of this printed circuit board, in such a manner as to face each other in this printed circuit board.

Patent Documents 2 and 3, on the other hand, each describe that wiring inductances can be reduced by disposing positive-electrode and negative-electrode external lead terminals of the semiconductor device in parallel.

Patent Document 1: Japanese Patent Application Publication No. 2009-64852 (paragraphs 0132 to 0134, and FIG. 17)
Patent Document 2: Japanese Patent Application Publication No. 2001-274322
Patent Document 3: Japanese Patent Application Publication No. 2004-214452

A semiconductor device is required to be able to reduce wiring inductances generated therein, in order to reduce a surge voltage that is generated upon the switching operation or an outside voltage surge.

Unfortunately, it is difficult for the semiconductor device shown in FIG. 16 to realize low inductances, considering the combinations of the wiring inductances of the insulating substrate with conductive patterns, the bonding wires, the external lead terminals, and the like.

Moreover, Patent Documents 1, 2 and 3 do not mention that the reduction of the wiring inductances and the sizes of the semiconductor devices can be realized by a combination of the structure in which the metal foil pieces on the front and rear surfaces of the printed circuit board with metal pins are disposed on the semiconductor chips in such a manner as to face each other, and the configuration in which the external lead terminals (P-terminal and N-terminal, U-terminal and P-terminal or N-terminal, etc.) formed from metal bars are disposed adjacent to each other in parallel.

According to Patent Document 1, the metal foil pieces on the front and rear surfaces of the printed circuit board face each other in the printed circuit board but are not aligned with the positions of the semiconductor chips, and the external lead terminals are connected to the misaligned positions, which increases the size of the printed circuit board, and hence the size of the semiconductor device. In addition, connecting the external lead terminals to the printed circuit board weakens the mechanical strengths of these connecting parts.

DISCLOSURE OF THE INVENTION

An object of the present invention is to solve the problems described above and to provide a downsized semiconductor device having a printed circuit board with metal pins, the semiconductor device being configured to reduce wiring inductances thereof.

In order to achieve this object, a semiconductor device according to the present invention has the following features. Specifically, the semiconductor device has: an insulating substrate having a first conductive pattern on a first insulating substrate; a first semiconductor element having one surface fixed to the first conductive pattern; a printed circuit board having a conductive layer on a second insulating substrate and a plurality of metal pins fixed to the conductive layer; and a third insulating substrate. A portion of pins constituting the metal pins is fixed to other surface of the first semiconductor element, and the printed circuit board with the metal pins is sandwiched between the insulating substrate having the first conductive pattern and the third insulating substrate.

Another aspect of the semiconductor device according to the present invention has the following features. The semiconductor device has: an insulating substrate with conductive patterns having at least a first conductive pattern, a second conductive pattern, and a third conductive pattern on a first insulating substrate; a positive-electrode external lead terminal fixed to the first conductive pattern; a negative-electrode external lead terminal fixed to the second conductive pattern; an external lead terminal of intermediate potential fixed to the third conductive pattern; a first semiconductor element having one surface fixed to the first conductive pattern; a second semiconductor element having one surface fixed to the third conductive pattern; and an insulating substrate with conductive pins having conductive layers on front and rear surfaces of a second insulating substrate respectively, a plurality of first conductive pins fixed to the conductive layer on the rear surface of the second insulating substrate, and a plurality of second conductive pins fixed to the conductive layer on the front surface of the second insulating substrate. The positive-electrode external lead terminal and the negative-electrode external lead terminal are disposed adjacent to each other in parallel. A portion of the pins constituting the first conductive pins is fixed to the other surface of the first semiconductor element, and the other pins constituting the first conductive pins are fixed to the third conductive pattern. A portion of the pins constituting the second conductive pins is fixed to the other surface of the second semiconductor element, and the other pins constituting the second conductive pins are fixed to the second conductive pattern. The insulating substrate with conductive pins is disposed on the other surface of the first semiconductor element and the other surface of the second semiconductor element. A size of an area in which the first semiconductor element and the second semiconductor element are disposed is substantially equivalent to a size of a face of the insulating substrate with conductive pins.

Another aspect of the semiconductor device according to the present invention has the following features. Specifically, the semiconductor device has: a first insulating substrate with conductive patterns having at least a first conductive pattern and a second conductive pattern on a first insulating substrate; a second insulating substrate with conductive patterns having at least a third conductive pattern on a third insulating substrate; a positive-electrode external lead terminal fixed to the first conductive pattern; a negative-electrode external lead terminal fixed to the second conductive pattern; an external lead terminal of intermediate potential fixed to the third conductive pattern; a first semiconductor element having one surface fixed to the first conductive pattern; a second semiconductor element having one surface fixed to the third conductive pattern; and an insulating substrate with conductive pins having conductive layers on front and rear surfaces of a second insulating substrate respectively, a plurality of first conductive pins fixed to the conductive layer on the rear surface of the second insulating substrate, and a plurality of second conductive pins fixed to the conductive layer on the front surface of the second insulating substrate. The positive-electrode external lead terminal and the negative-electrode external lead terminal are disposed adjacent to each other in parallel. A portion of the pins constituting the first conductive pins is fixed to the other surface of the first semiconductor element, and the other pins constituting the first conductive pins are fixed to the third conductive pattern. A portion of the pins constituting the second conductive pins is fixed to the other surface of the second semiconductor element, and the other pins constituting the second conductive pins are fixed to the second conductive pattern. The insulating substrate with conductive pins is sandwiched between the other surface of the first semiconductor element and the other surface of the second semiconductor element.

In the semiconductor device of the present invention, according to the invention described above, it is preferred that the insulating substrate with conductive pins is a printed circuit board with metal pins, which has metal foil pieces fixed, respectively, to the front and rear surfaces of the second insulating substrate made of ceramic, a first metal pin fixed to the metal foil piece on the rear surface, and a second metal pin fixed to the metal foil piece on the front surface.

In the semiconductor device of the present invention, according to the invention described above, it is preferred that the positive-electrode external lead terminal and the negative-electrode external lead terminal are rectangular conductive plates.

In the semiconductor device of the present invention, according to the invention described above, it is preferred that the first semiconductor element and the second semiconductor element are connected in series through the first conductive pins and the third conductive pattern and be 2-in-1, 4-in-1, or 6-in-1 semiconductor modules each configuring an upper arm or a lower arm.

In the semiconductor device of the present invention, according to the invention described above, it is preferred that the first semiconductor element and the second semiconductor element are each configured by a switching transistor chip and a diode chip connected antiparallel to the switching transistor chip.

In the semiconductor device of the present invention, according to the invention described above, it is preferred that the switching transistor chip is an IGBT chip, a MOSFET chip, a junction field-effect transistor chip, or a bipolar transistor chip, and that the diode chip is a pn diode chip or a Schottky barrier diode chip.

In the semiconductor device of the present invention, according to the invention described above, it is preferred that three sides of the second conductive pattern is surrounded by the first conductive pattern.

In the semiconductor device of the present invention, according to the invention described above, it is preferred that the second conductive pins fixed to the second conductive pattern penetrate the second insulating substrate.

The present invention can provide a semiconductor device which is configured to be able to reduce wiring inductances by disposing semiconductor elements on an insulating substrate with conductive patterns, disposing an insulating substrate with conductive pins on the surface of the insulating substrate with conductive patterns on which the semiconductor elements are disposed, fixing a plurality of external lead terminals to the insulating substrate with conductive patterns, and disposing a positive-electrode external lead terminal and a negative-electrode lead terminal adjacent to each other in parallel. The wiring inductances of the semiconductor device can also be reduced by forming these external lead terminals from conductive plates.

The size of the insulating substrate with conductive pins and hence the size of the semiconductor device can be reduced by disposing the conductive layers above the semiconductor elements, the conductive layers being formed respectively on the front and rear surfaces of the insulating substrate with conductive pins in such a manner as to face each other.

Moreover, fixing the plurality of semiconductor elements to the different insulating substrates with conductive patterns in such manner that the semiconductor elements face each other with the insulating substrate with conductive pins therebetween, and then fixing the conductive pins to the semiconductor elements and the conductive patterns, can realize production of a semiconductor device with low wiring inductances and a small surface area.

BRIEF DESCRIPTION OF THE DRAWINGS

FIGS. 1(a), 1(b) are configuration diagrams showing substantial parts of a semiconductor module 100 according to a first embodiment of the present invention, wherein FIG. 1(a) is a plan view of the substantial parts, and FIG. 1(b) is a cross-sectional diagram of the substantial parts taken along the line X-X of FIG. 1(a).

FIGS. 2(a), 2(b) are plan views of metal foil pieces and metal pins on a printed circuit board with metal pins, viewed in the direction of the arrow P shown in FIG. 1(b), wherein FIG. 2(a) is a diagram showing the metal foil piece and metal pins on the front surface, and FIG. 2(b) is a diagram showing the metal foil piece and metal pins on the rear surface.

FIGS. 5(a), 5(b) are diagrams showing paths of currents flowing through the 2-in-1 semiconductor module 100 at the time of commutation, wherein FIG. 5(a) is a plan view showing the paths of currents flowing to a metal foil piece 15 on the front surface and a metal foil piece 16 on the rear surface, and FIG. 5(b) is a cross-sectional diagram showing the paths of currents.

FIGS. 15(a), 15(b) are configuration diagrams showing substantial parts of a modification of the semiconductor module 100 according to the first embodiment of the present invention, wherein FIG. 15(a) is a plan view of the substantial parts, and FIG. 15(b) is a cross-sectional diagram of the substantial parts taken along the line X-X of FIG. 15(a).

BEST MODES FOR CARRYING OUT THE INVENTION

Embodiments of the present invention are now described hereinafter using the following embodiments.

First Embodiment

Figure 1A:
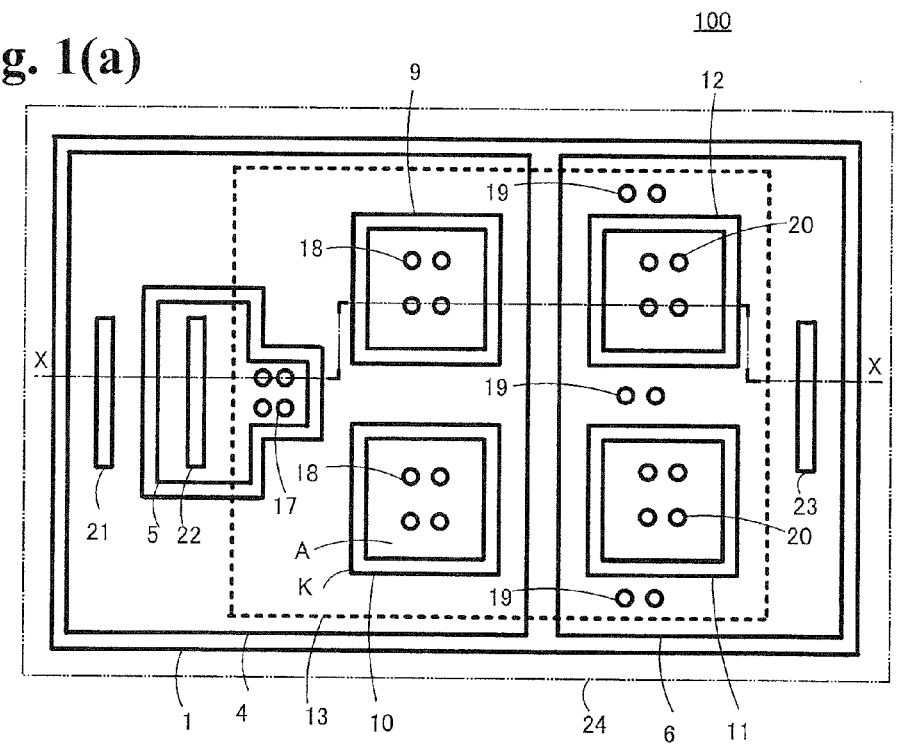
Figure 1B:
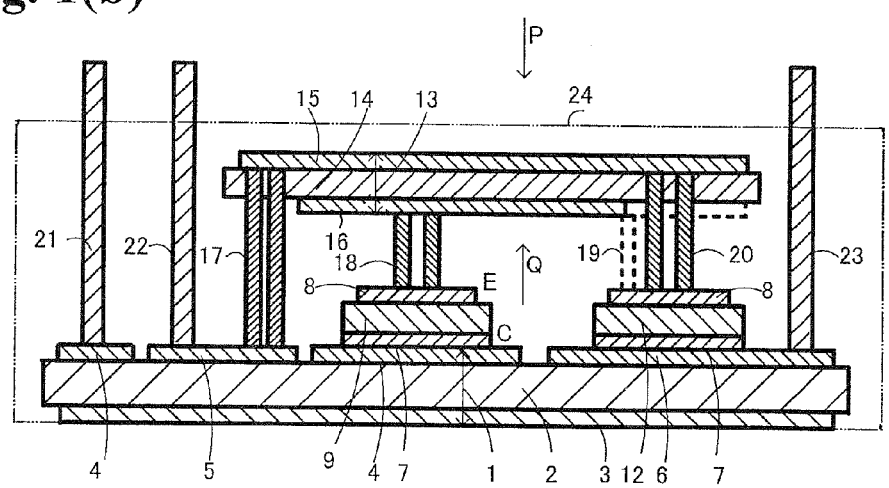

FIGS. 1(a), 1(b) are configuration diagrams showing substantial parts of a semiconductor module device 100 according to a first embodiment of the present invention, wherein FIG. 1(a) is a plan view of the substantial parts, and FIG. 1(b) is a cross-sectional diagram of the substantial parts taken along the line X-X of FIG. 1(a). For simplification of understanding the present invention, the dotted lines in FIGS. 1(a), 1(b) represent a printed circuit board with metal pins 13, and the solid lines represent members disposed below the printed circuit board with metal pins 13.

Figure 2A:
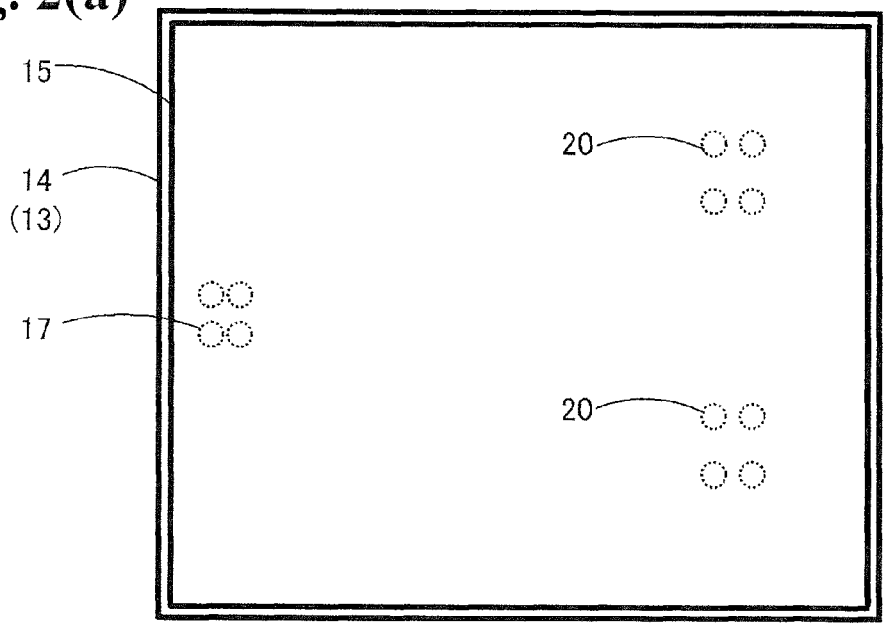
Figure 2B:
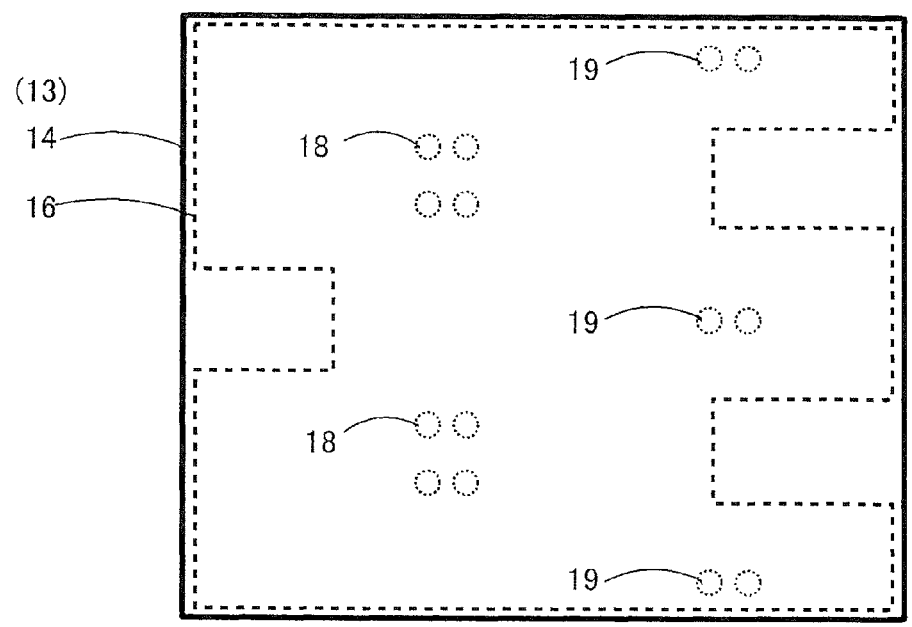

FIGS. 2(a), 2(b) are plan views of metal foil pieces and metal pins on the printed circuit board with metal pins 13 viewed in the direction of the arrow P shown in FIG. 1(b), wherein FIG. 2(a) is a diagram showing the metal foil piece and metal pins on the front surface, and FIG. 2(b) is a diagram showing the metal foil piece and metal pins on the rear surface. Gate terminals are not shown in the diagrams.

Figure 3:
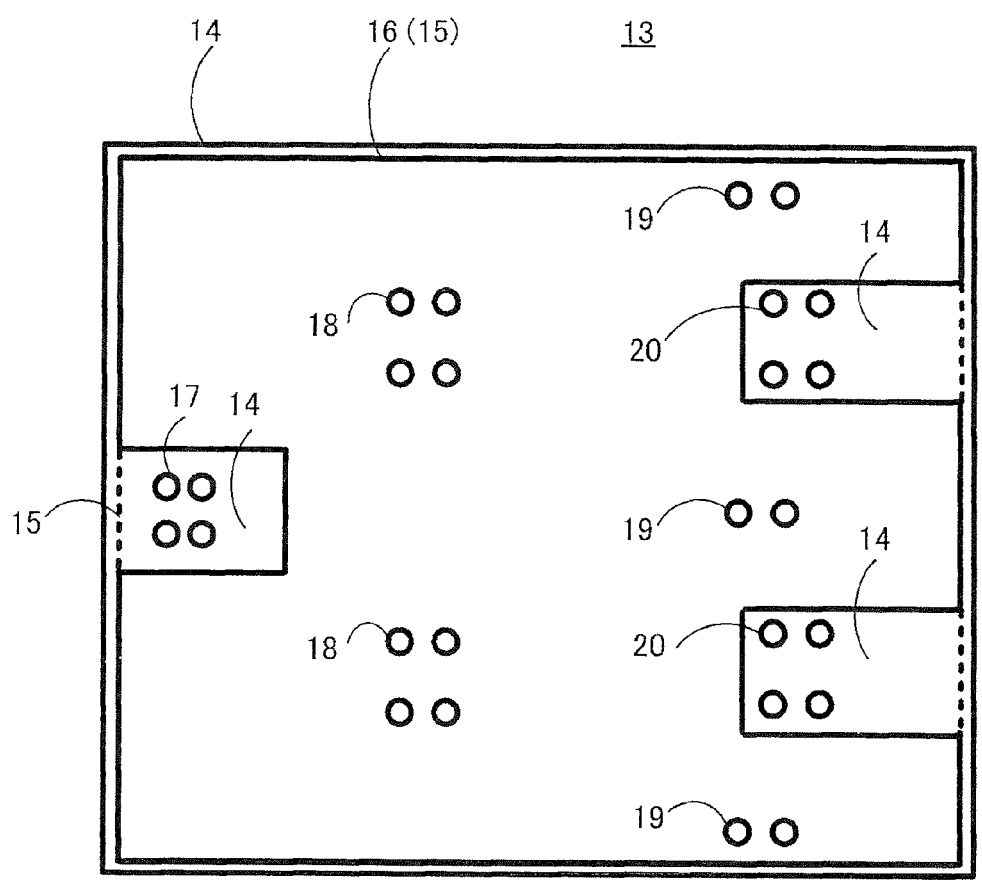
FIG. 3 is a plan view of the backs of the metal foil pieces and the metal pins disposed on the front and rear surfaces of the printed circuit board with metal pins viewed in the direction of the arrow Q shown in FIG. 1(b).

FIG. 3 is a plan view of the backs of the metal foil pieces and the metal pins disposed on the front and rear surfaces of the printed circuit board with metal pins 13 viewed in the direction of the arrow Q shown in FIG. 1(b).

This semiconductor module device 100 shown in FIGS. 1(a) to is a 2-in-1 semiconductor module that is configured by an upper arm with a pair of chips, i.e., an IGBT (insulated gate bipolar transistor) chip 9 and a FWD (free-wheeling diode) chip 10 connected antiparallel to the IGBT chip 9, and a lower arm with a pair of chips, i.e., an IGBT chip 11 and a FWD chip 12 connected antiparallel to the IGBT chip 11 (the IGBT and the FWD that are connected antiparallel to each other are also called "semiconductor elements," hereinafter). The IGBT chips 9, 11 each have a collector terminal C on one of the surfaces thereof and an emitter terminal E on the other surface. The FWD chips 10, 12 each have a cathode terminal K on one of the surfaces thereof and an anode terminal A on the other surface. In an insulating substrate with conductive patterns 1, conductive patterns 4, 5, 6 are formed on a front surface of a ceramic substrate 2, and a back-surface conductive film 3 on a rear surface of the same. The conductive pattern 5 is in the shape of an island, surrounded by the conductive pattern 4. Metal foil pieces may be joined to these conductive patterns 4, 5, 6 and the back-surface conductive film 3 to obtain a thick conductor.

The printed circuit board with metal pins 13 is formed by joining metal foil pieces 15, 16 to front and rear surfaces of a ceramic insulating substrate 14, respectively. Therefore, the metal foil piece 15 on the front surface and the metal foil piece 16 on the rear surface face each other in the printed circuit board with metal pins 13. The printed circuit board with metal pins 13 is disposed on the semiconductor elements side of the insulating substrate with conductive patterns 1. Metal pins 17, 18, 19, 20 are fixed to the metal foil pieces 15, 16 of the printed circuit board with metal pins 13 in the same direction. These metal pins and metal foil pieces may be conductive pins or conductors with large electrical conduction.

The metal pins 17, 20 are fixed to the metal foil piece 15 on the front surface, and the metal pins 18, 19 are fixed to the metal foil piece 16 on the rear surface, so as to be electrically connected to the metal foil pieces 15 and 16. The metal pins 17 are fixed to the metal foil piece 15 and penetrate the insulating substrate 14. External lead terminals are, respectively, a P-terminal 21, an N-terminal 22, and a U-terminal 23. The P-terminal 21 and the N-terminal 22 are disposed close to each other in parallel.

The collector of the IGBT chip 9, the cathode of the FWD 10, and the P-terminal 21 are fixed and electrically connected to the conductive pattern 4 on the insulating substrate with conductive patterns 1. The N-terminal 22 is fixed and electrically connected to the conductive pattern 5. The collector of the IGBT chip 11, the cathode of the FWD chip 12, and the U-terminal 23 are fixed and electrically connected to the conductive pattern 6.

The metal pins 17 are fixed and electrically connected to the conductive pattern 5, and the metal pins 18 are fixed and electrically connected to the emitter of the IGBT chip 9 and the anode of the FWD chip 10. The metal pins 19 are fixed and electrically connected to the conductive pattern 6, and the metal pins 20 are fixed and electrically connected to the emitter of the IGBT chip 11 and the anode of the FWD chip 12. Note that the IGBT chips 9, 11 and the FWD chips 10, 12 are fixed by solder 7, 8, joining materials. Needless to say, a joining material other than solder or a sintered material can be used in place of the solder 7, 8.

The shape of the printed circuit board with metal pins 13 is selected in such a manner as to enable easy connection of the metal pins 17 to 20 to the IGBT chips 9, 11, the FWD chips 10, 12, and the conductive patterns 5, 6. The shape of the printed circuit board with metal pins 13, therefore, can be, for example, a square or a rectangle. The size of the printed circuit board with metal pins 13 is substantially the same as that of, for example, the area surrounding the IGBT chips 9, 11 and the FWD chips 10, 12. In other words, it is preferred that the size of the printed circuit board with metal pins 13 be substantially the same as that of the area that includes the sections of the conductive patterns 5, 6 to which the metal pins 17, 19 are fixed. This area corresponds to the area shown in, for example, the dotted line (reference numeral 13) in FIG. 1(a).

The entire insulating substrate with conductive patterns 1 is sealed with epoxy resin 24 in such a manner that tips of the P-terminal 21, the N-terminal 22 and the U-terminal 23, which are external lead terminals, are exposed, as well as the back-surface conductive film 3 of the insulating substrate with conductive patterns 1. Consequently, the 2-in-1 semiconductor module 100 is completed.

Figure 4:
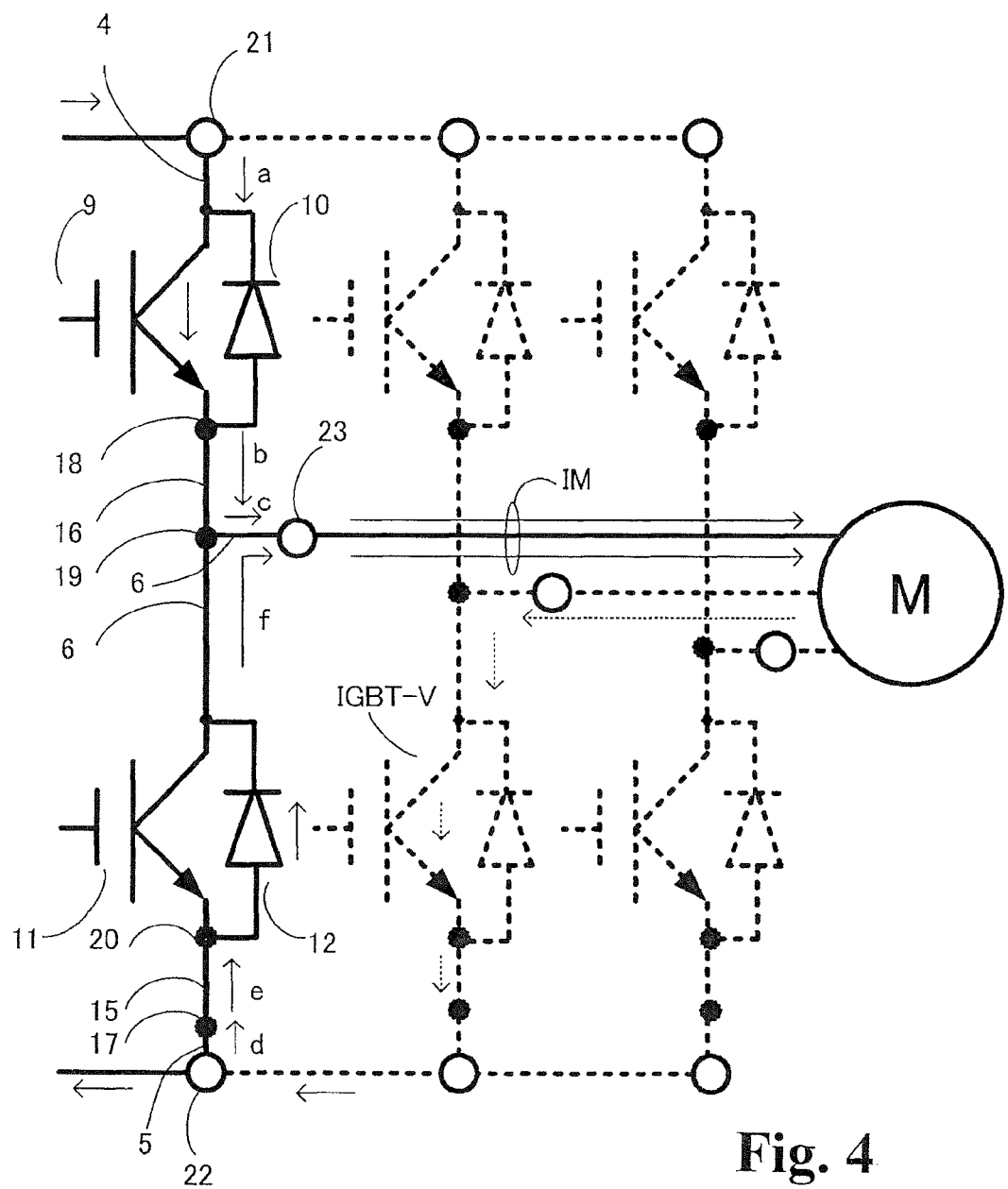
FIG. 4 shows a circuit diagram of the 2-in-1 semiconductor module 100 and a diagram showing directions of currents flowing at the time of commutation.

FIG. 4 shows a circuit diagram of the 2-in-1 semiconductor module 100 and a diagram showing directions of currents flowing at the time of commutation.

Figure 5A:
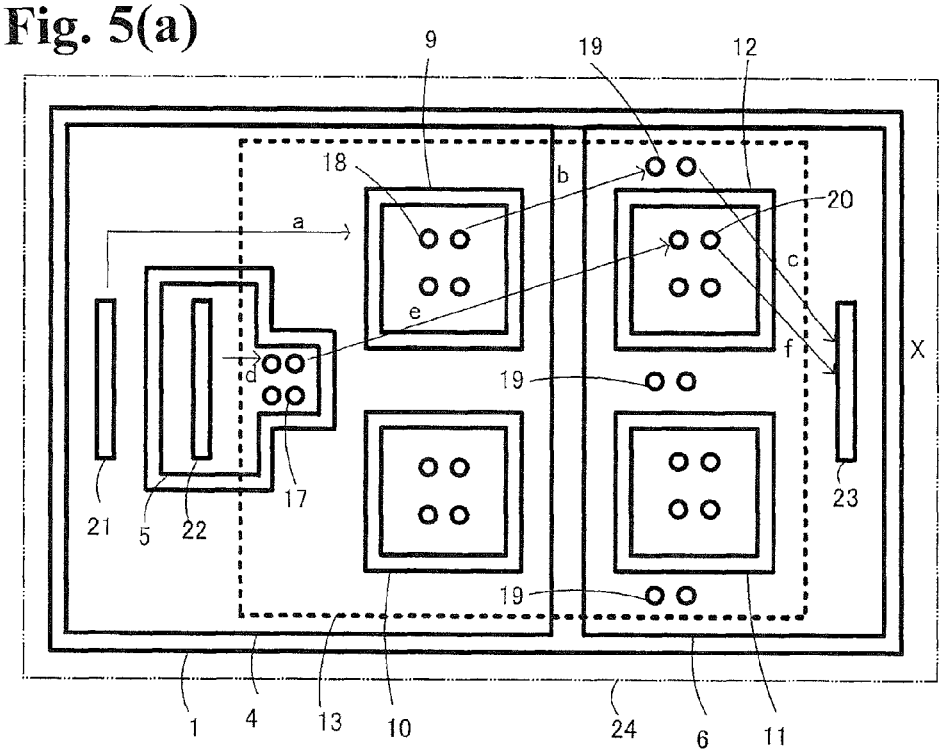
Figure 5B:
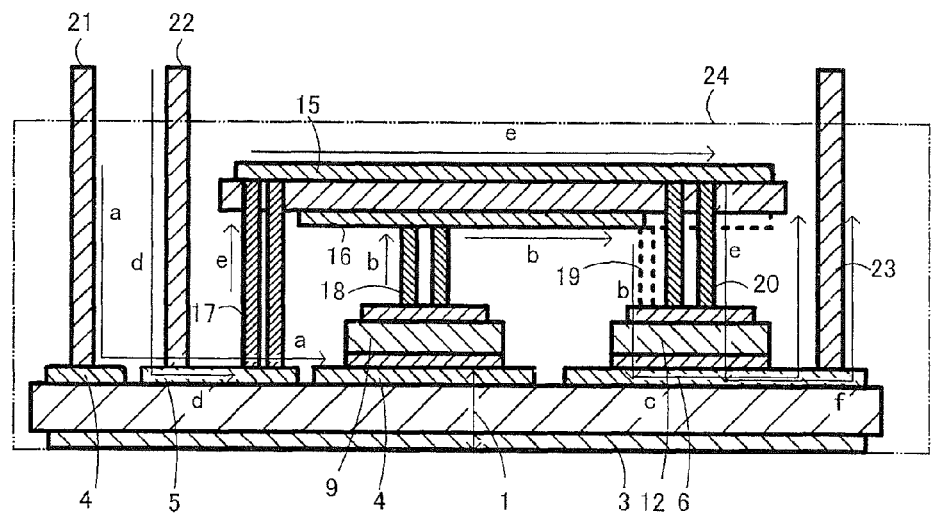

FIGS. 5(a), 5(b) are diagrams showing paths of currents flowing through the 2-in-1 semiconductor module 100 at the time of commutation, wherein FIG. 5(a) is a plan view showing the paths of currents flowing to the metal foil piece 15 on the front surface and the metal foil piece 16 on the rear surface, and FIG. 5(b) is a cross-sectional diagram showing the paths of currents.

Commutation occurs when, for example, a U-phase upper arm element (the IGBT chip 9 in this case) is switched to its OFF state and a W-phase upper arm element is switched to its ON state.

The dotted lines represent the other arms configuring a 3-phase inverter circuit.

Currents a, b, c that flow through the path of the P-terminal 21—the IGBT chip 9—the U-terminal 23—a load M (motor) diminish because the IGBT chip 9 is switched to its OFF state. The current a flows through the conductive pattern 4, and the current b flows through the metal pins 18, the metal foil piece 16 on the rear surface, and then the metal pins 19. The current c flows through the conductive pattern 6.

On the other hand, because a current IM flowing to the load remains constant, currents d, e, f flow through the path of a V-phase lower arm element (IGBT-V)—the N-terminal 22—the FWD chip 12—the U-terminal 23—the load M, in an ascending manner. The current d flows through the conductive pattern 5, and the current e flows through the metal pins 17, the metal foil piece 15 on the front surface, and then the metal pins 20. The current f flows through the conductive pattern 6 into the U-terminal 23.

The current a and the current e face each other and flow in the same direction. The current b and the current e also face each other and flow in the same direction. A voltage that is generated in the conductive pattern as the product of a reduction rate of the current a (−di/dt) and an inductance (L) of the conductive pattern 4 (L·(−di/dt)) is canceled out by a magnetic flux resulting from an increase rate of the current e, and becomes small.

A voltage that is generated in the conductive pattern as the product of a reduction rate of the current b (−di/dt) and an inductance (L) of the metal foil piece 16 (L·(−di/dt)) is canceled out by a magnetic flux resulting from the increase rate of the current e, and becomes small.

Due to the configuration described above in which the conductive pattern 4 and the metal foil piece 15 are disposed close to each other in parallel, as well as the metal foil piece 15 and the metal foil piece 16, the wiring inductances can be reduced, as well as the voltages that are generated in the conductive pattern 4 and the metal foil pieces 15, 16 due to the wiring inductances at the time of commutation. The wiring inductances here mean the inductances associated with wiring, such as self-inductances, mutual inductances, and floating inductances.

Reducing the voltages generated due to the wiring inductances as described above can suppress a rising voltage (surge voltage) that occurs when the IGBT chip 9 is switched to its OFF state.

Moreover, the wiring inductances can be reduced by forming the P-terminal 21 and the N-terminal 22, which are external lead terminals, from metal bars (plates) and disposing these terminals adjacent to each other in parallel.

The wiring inductances can also be reduced by shortening the metal pins 17 to 20 to reduce the distance between the printed circuit board with metal pins 13 and the conductive pattern 4.

As described above, the metal foil piece 15 and the metal foil piece 16 that are disposed on the front and rear surfaces of the printed circuit board with metal pins 13 respectively are configured to face each other in the printed circuit board 13. Such a configuration leads to a reduction of the wiring inductances that have an impact on the insulating substrate at the time of commutation.

A large-current element, too, has a di/dt thereof increased in the same manner, but the configuration of this semiconductor module 100 described above can prevent the occurrence of a large surge voltage.

Further, the metal foil pieces 15, 16, formed on the front and rear surfaces of the printed circuit board with metal pins 13 respectively so as to face each other, are disposed above the semiconductor chips 9 to 12, whereby the size of the printed circuit board with metal pins 13 can be reduced, and hence the size of the semiconductor module 100 can be reduced.

Due to such a configuration, the occurrence of a large surge voltage can be prevented even in a semiconductor device that has a high switching speed and is mounted with a device with a large di/dt, such as a silicon carbide and other wide-gap semiconductors.

Next is described a method for calculating the wiring inductances of the 2-in-1 semiconductor module 100 by simulation. An inductance of the wiring connecting the P-terminal 21 and the N-terminal 22 to each other is calculated by simulation. This inductance does not necessarily coincide with an inductance that occurs when operating two or three semiconductor modules 100 that are connected to each another and embedded with single-phase inverter circuits or 3-phase inverter circuits. However, it is at least confirmed that as long as this inductance calculated by simulation is small, the inductance generated during the operation is also small.

The inductance calculated by simulation is significantly reduced in the semiconductor module 100 of the present invention as compared to the conventional semiconductor module 500. This inductance decrease is approximately, for example 1/8 to 1/5 of that of the conventional semiconductor module 500.

Second Embodiment

Figure 6:
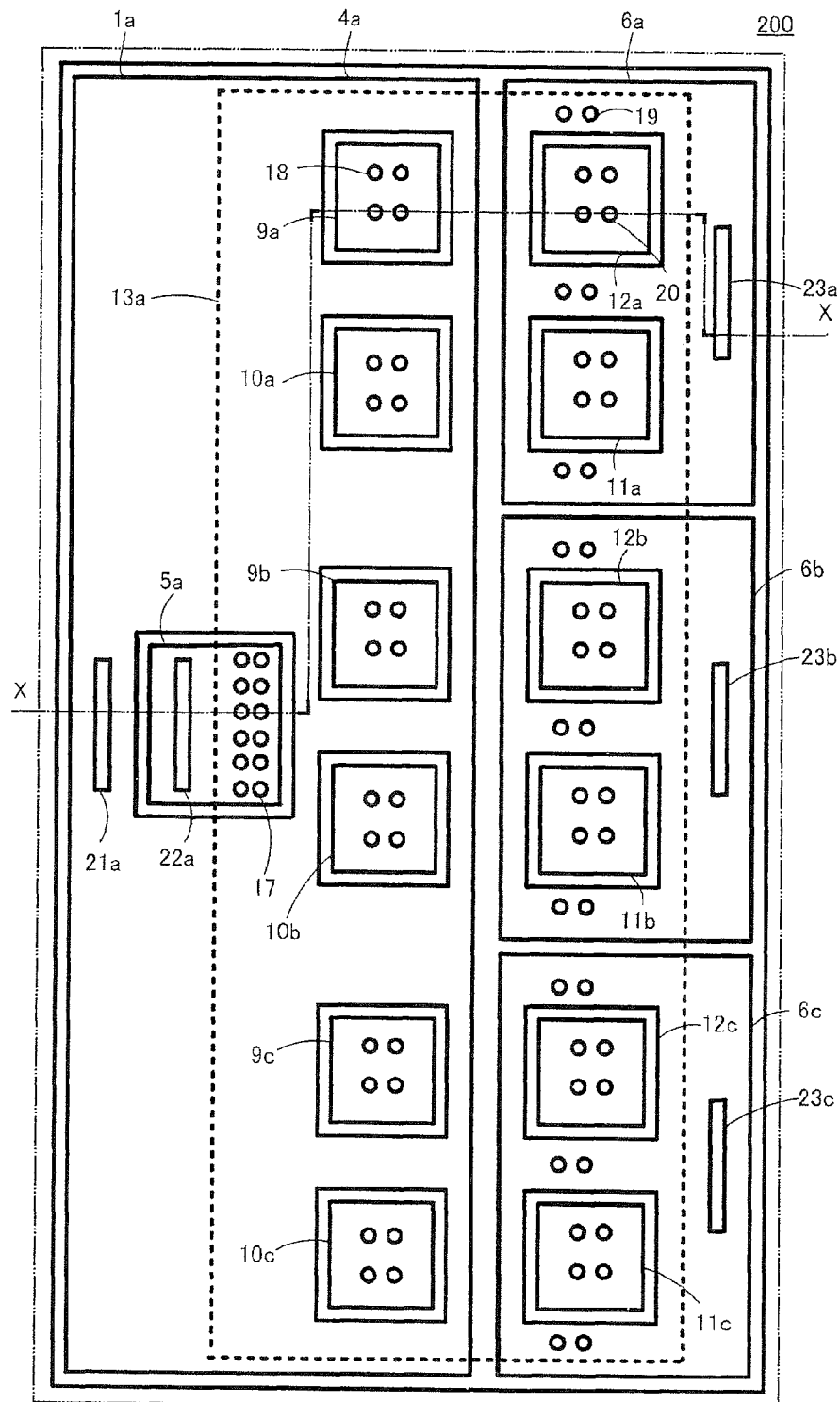
FIG. 6 is a plan view showing substantial parts of a semiconductor device according to a second embodiment of the present invention.
Figure 7:
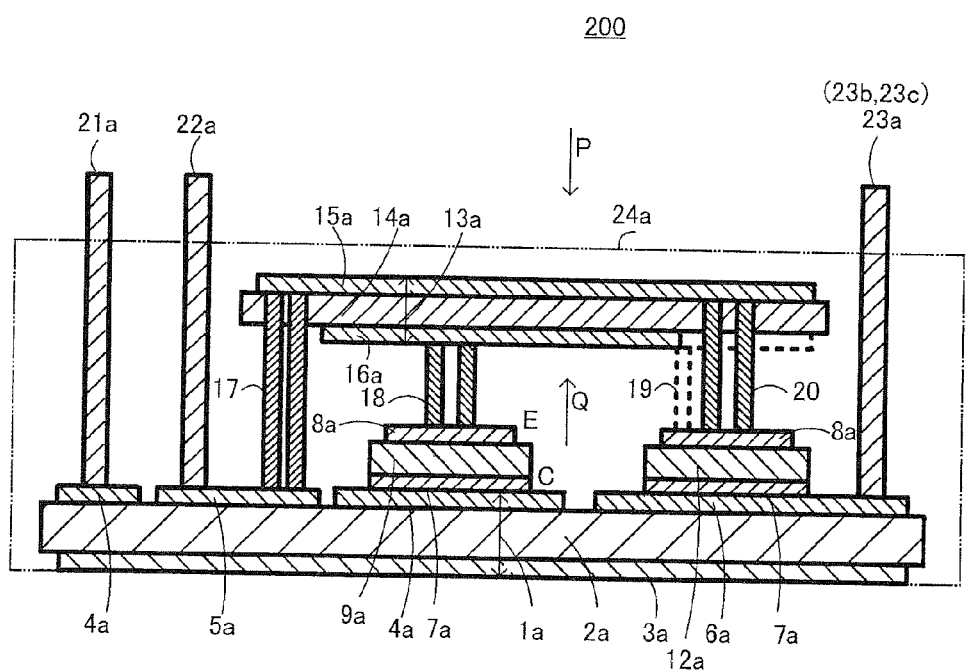
FIG. 7 is a cross-sectional diagram of the substantial parts taken along the line X-X of FIG. 6.
Figure 8:
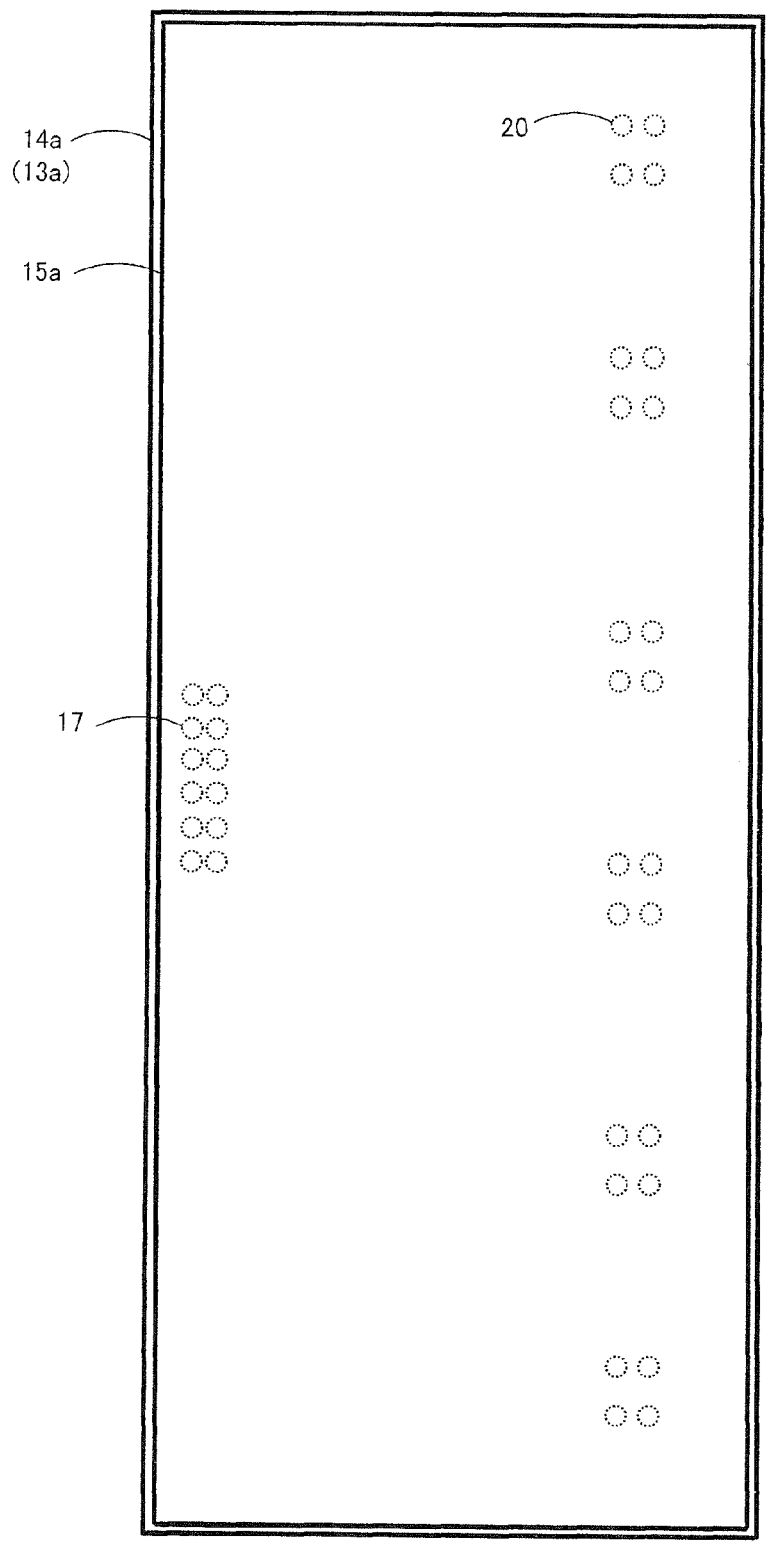
FIG. 8 is a plan view of a metal foil piece and metal pins on a front surface of a printed circuit board with metal pins viewed in the direction of the arrow P shown in FIG. 7.
Figure 9:
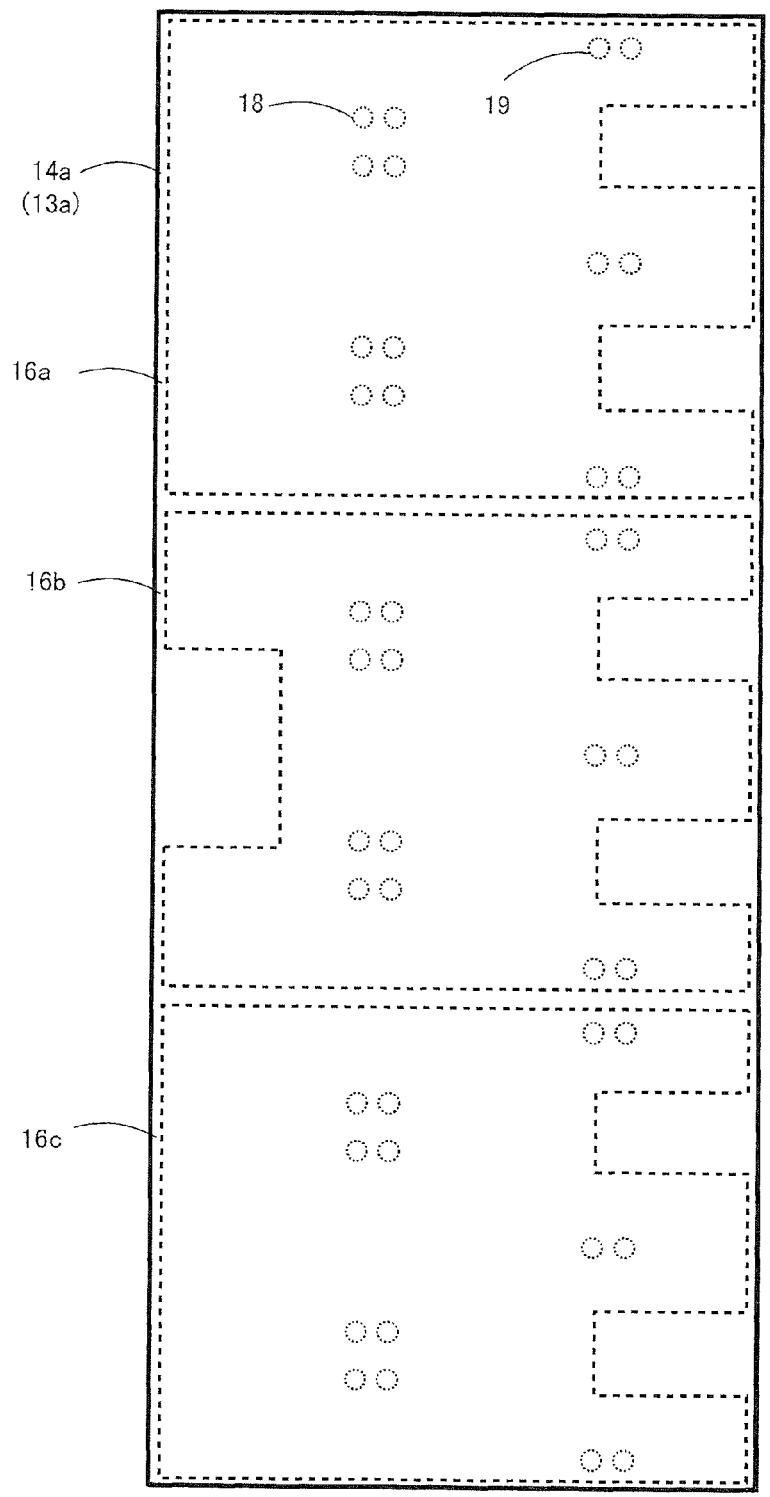
FIG. 9 is a plan view of metal foil pieces and metal pins on a rear surface of the printed circuit board with metal pins viewed in the direction of the arrow P shown in FIG. 7.
Figure 10:
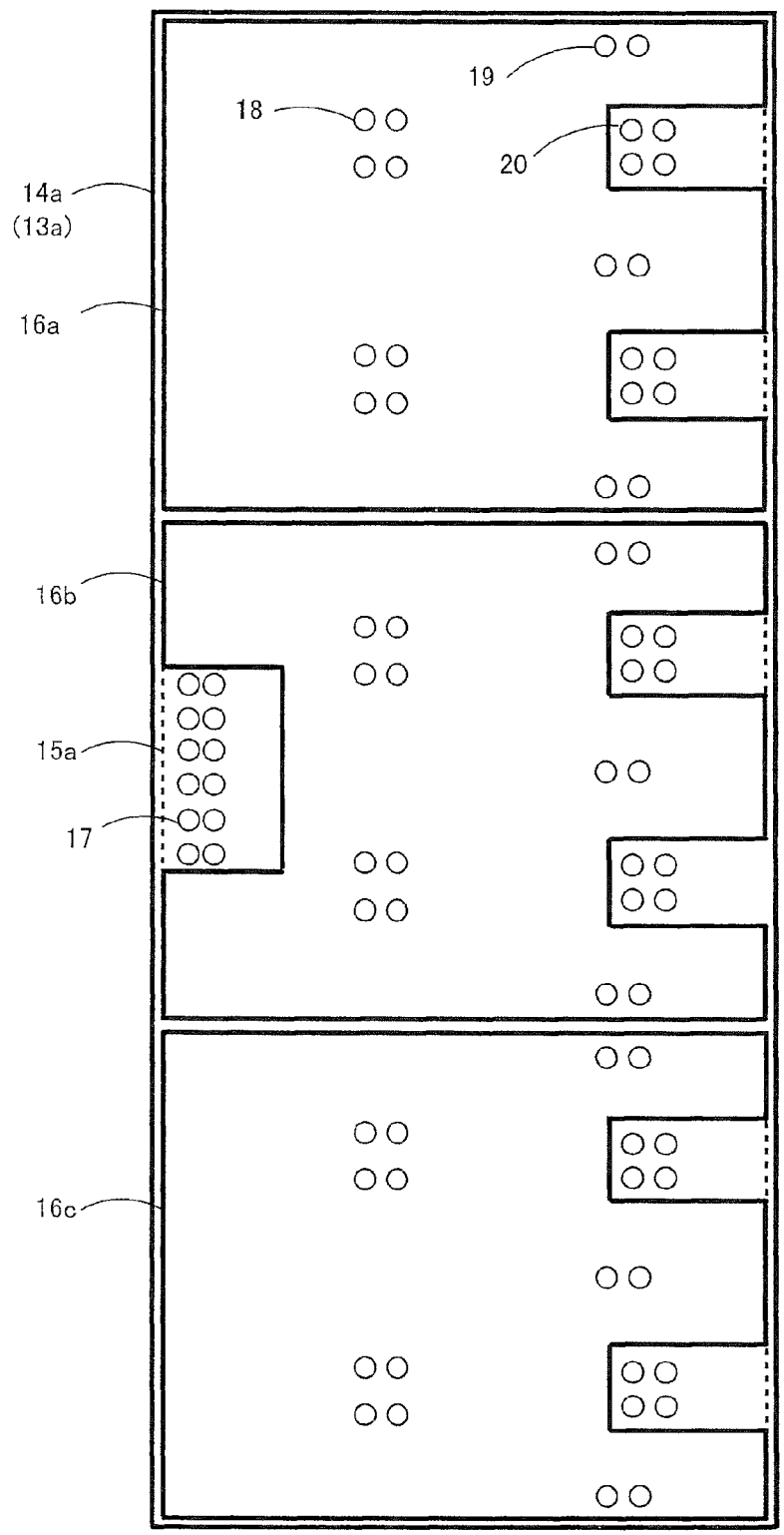
FIG. 10 is a plan view of the backs of the metal foil pieces and the metal pins disposed on the front and rear surfaces of the printed circuit board with metal pins viewed in the direction of the arrow Q shown in FIG. 7.

FIGS. 6 and 7 are each a configuration diagram of a semiconductor device according to a second embodiment of the present invention. FIG. 6 is a plan view showing substantial parts of the semiconductor device, and FIG. 7 is a cross-sectional diagram of the substantial parts taken along the line X-X of FIG. 6. For simplification of understanding the present invention, the dotted line in FIG. 6 represents a printed circuit board with metal pins 13a, and the solid lines represent members disposed below the printed circuit board with metal pins 13a. FIGS. 8 and 9 are each a configuration diagram of the printed circuit board with metal pins 13a. FIG. 8 is a plan view of a metal foil piece and metal pins on a front surface of the printed circuit board with metal pins viewed in the direction of the arrow P shown in FIG. 7, and FIG. 9 is a plan view of metal foil pieces and metal pins on a rear surface of the printed circuit board with metal pins viewed in the direction of the arrow P shown in FIG. 7. FIG. 10 is a plan view of the backs of the metal foil pieces and the metal pins disposed on the front and rear surfaces of the printed circuit board with metal pins 13a viewed in the direction of the arrow Q shown in FIG. 7.

The difference between FIGS. 1(a), 1(b) and FIGS. 6 and 7 is that the IGBT chips and the FWD chips that are embedded in the 2-in-1 semiconductor module of FIGS. 1(a), 1(b) are disposed in a U-phase, a V-phase, and a W-phase. The number of metal pins 17 is three times more than that shown in FIG. 1(a).

This semiconductor device 200 is configured by the U-phase, the V-phase, and the W-phase. The U-phase is configured by an upper arm with a pair of chips (semiconductor elements), i.e., an IGBT chip 9a and a FWD 10a connected antiparallel to the IGBT chip 9a, and a lower arm with a pair of chips, i.e., an IGBT chip 11a and a FWD chip 12a connected antiparallel to the IGBT chip 11a. Similarly, the V-phase is configured by upper and lower arms with respective pairs of chips, i.e., IGBT chips 9b, 11b and FWD chips 10b, 12b connected antiparallel to the IGBT chips 9b, 11b. In the same way, the W-phase is configured by upper and lower arms with respective pairs of chips, i.e., IGBT chips 9c, 11c and FWD chips 10c, 12c connected antiparallel to the IGBT chips 9c, 11c.

In an insulating substrate with conductive patterns 1a, conductive patterns 4a, 5a, 6a, 6b, 6c are formed on a front surface of a ceramic substrate 2a, and a back-surface conductive film 3a on a rear surface of the same. The conductive pattern 5a is in the shape of an island, surrounded by the conductive pattern 4a. Metal foil pieces may be joined to these conductive patterns 4a, 5a, 6a, 6b, 6c and the back-surface conductive film 3a to obtain a thick conductor.

The printed circuit board with metal pins 13a is formed by joining metal foil pieces 15a, 16a to front and rear surfaces of a ceramic insulating substrate 14a, respectively. Therefore, the metal foil piece 15a on the front surface and the metal foil piece 16a on the rear surface face each other in the printed circuit board with metal pins 13a. The printed circuit board with metal pins 13a is disposed on the semiconductor elements side of the insulating substrate with conductive patterns 1a. Metal pins 17, 18, 19, 20 are fixed to the metal foil pieces 15a, 16a in the same direction.

The metal pins 17, 20 are fixed to the metal foil piece 15a on the front surface, and the metal pins 18, 19 are fixed to the metal foil piece 16a on the rear surface, so as to be electrically connected to the metal foil pieces 15a and 16a. The metal pins 17 are fixed to the metal foil piece 15a and penetrate the insulating substrate 14a. External lead terminals are, respectively, a P-terminal 21a, an N-terminal 22a, a U-terminal 23a, a V-terminal 23b, and a W-terminal 23c. The P-terminal 21a and the N-terminal 22a are disposed close to each other in parallel.

The collectors of the IGBT chips 9a, 9b, 9c, the cathodes of the FWD chips 10a, 10b, 10c, and the P-terminal 21a are fixed and electrically connected to the conductive pattern 4a on the insulating substrate with conductive patterns 1a. The N-terminal 22a is fixed and electrically connected to the conductive pattern 5a. The collectors of the IGBT chips 11a, 11b, 11c, the cathodes of the FWD chips 12a, 12b, 12c, the U-terminal 23a, the V-terminal 23b, and the W-terminal 23c are fixed and electrically connected to the conductive patterns 6a, 6b, 6c, respectively. These IGBT chips and FWD chips are fixed to the conductive patterns by solder 7a, a joining material.

The metal pins 17 are fixed and electrically connected to the conductive pattern 5a, and the metal pins 18 are fixed and electrically connected to the emitters of the IGBT chips 9a, 9b, 9c and the anodes of the FWD chips 10a, 10b, 10c by solder 8a, a joining material. The metal pins 19 are fixed to the conductive pattern 6a, and the metal pins 20 are fixed and electrically connected to the emitters of the IGBT chip 11a, 11b, 11c and the anodes of the FWD chips 12a, 12b, 12c by the solder 8a, the joining material.

The entire insulating substrate with conductive patterns 1a is sealed with epoxy resin 24a in such a manner that tips of the P-terminal 21a, the N-terminal 22a, the U-terminal 23a, the V-terminal 23b, and the W-terminal 23c, which are external lead terminals, are exposed, as well as the back-surface conductive film 3a of the insulating substrate with conductive patterns 1a. Consequently, the 6-in-1 semiconductor module 200 is completed.

Figure 11:
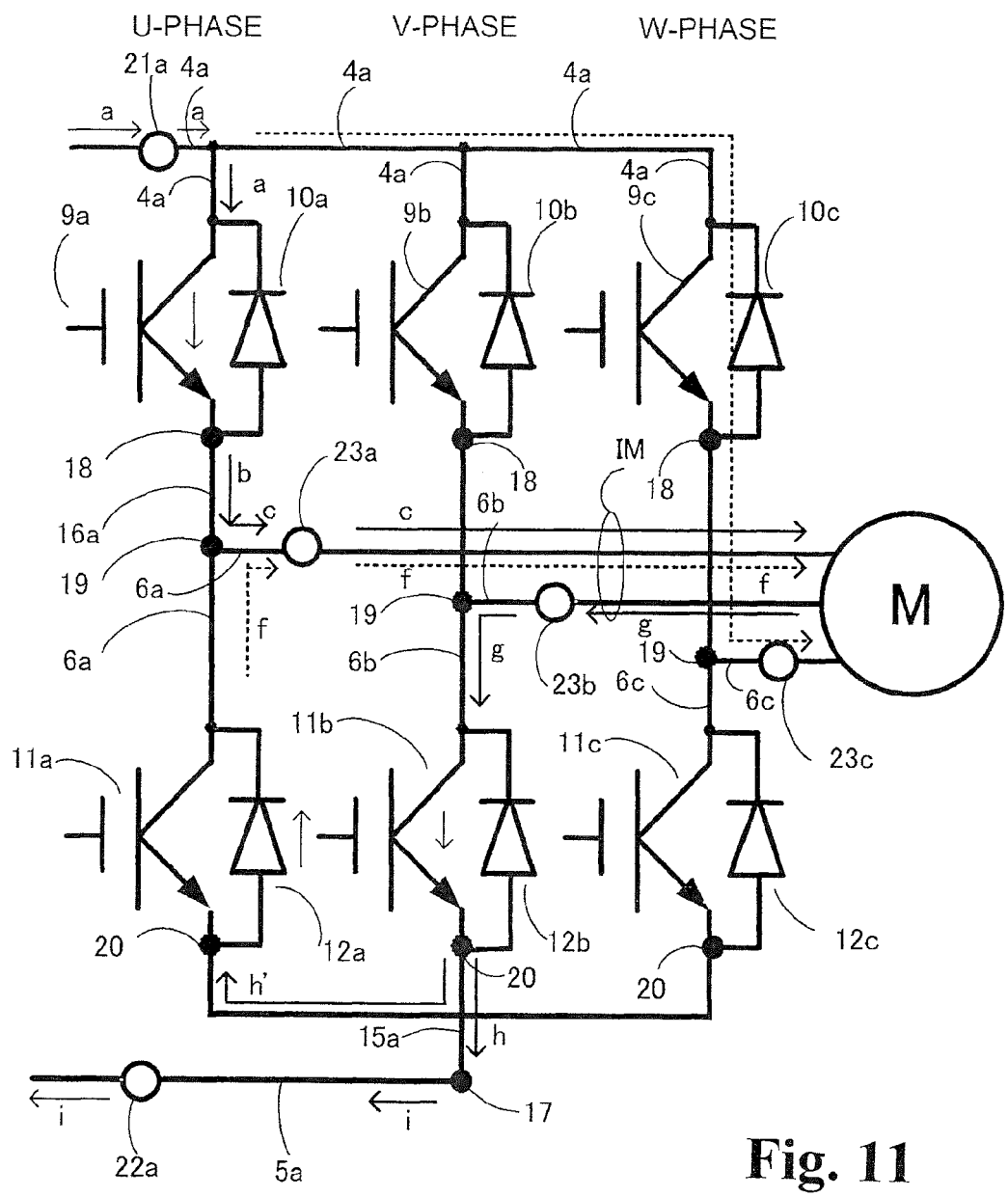
FIG. 11 shows a circuit diagram of the semiconductor module embedded with a 3-phase inverter circuit, and a diagram showing currents flowing at the time of a steady operation.

FIG. 11 shows a circuit diagram of the semiconductor module embedded with a 3-phase inverter circuit, and a diagram showing currents flowing at the time of a steady operation.

Figure 12:
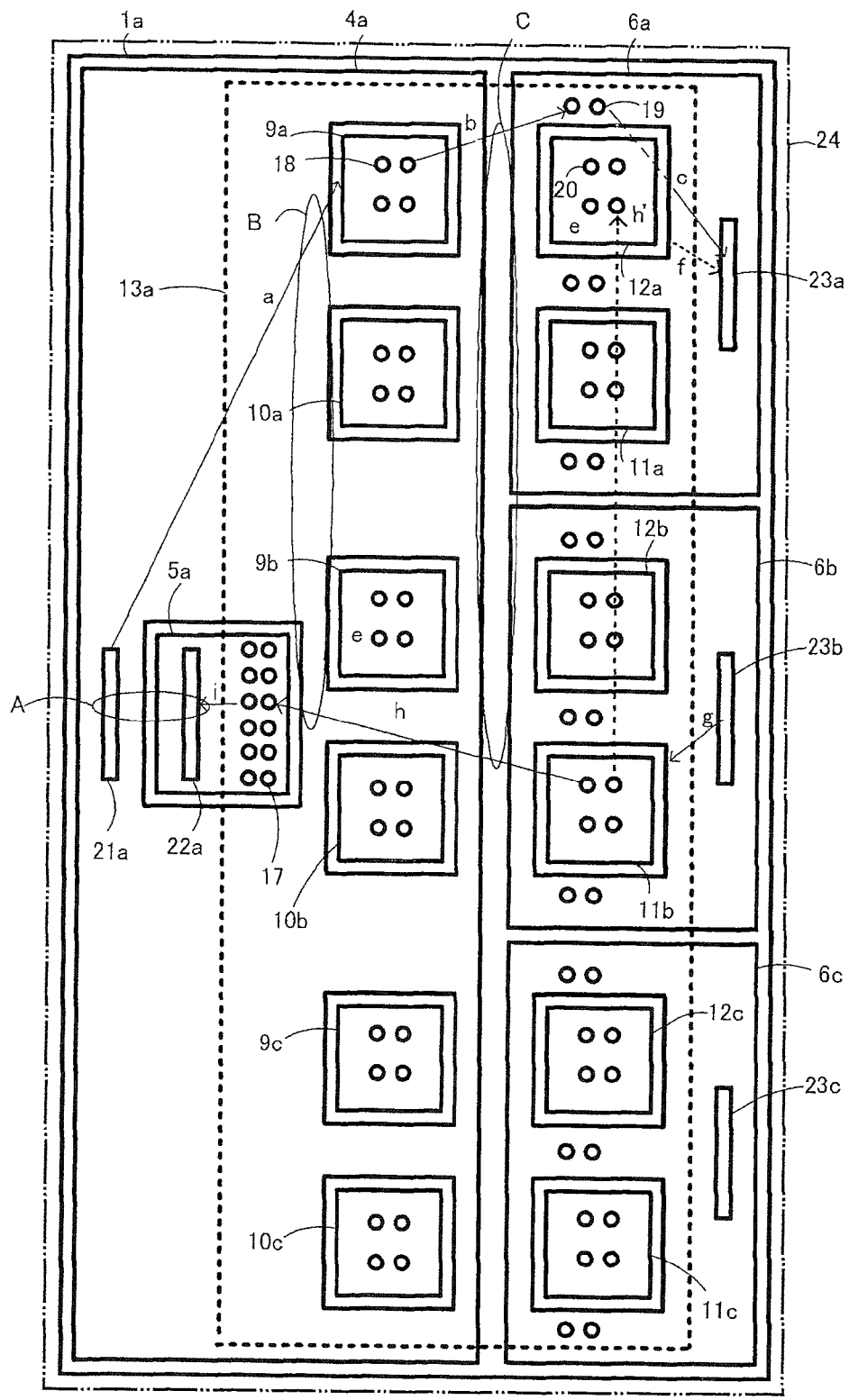
FIG. 12 is a diagram showing, based on FIG. 7, paths of currents flowing at the time of the steady operation and commutation.

FIG. 12 is a diagram showing, based on FIG. 7, paths of currents flowing at the time of the steady operation and commutation.

At the time of the steady operation, a current entering the P-terminal 21a flows, for example, to a load M through the U-terminal 23a. The current then returns from the load M to, for example, the V-terminal 23b and then to the N-terminal 22a. More specifically, a current a of the conductive pattern 4a enters the metal foil piece 16a through the IGBT chip 9a, while a current b of the metal foil piece 16a enters the conductive pattern 6a through the metal pins 19. A current c entering the conductive pattern 6a flows to the load M through the U-terminal 23a.

A current g returning from the load M enters the IGBT chip 11b through the conductive pattern 6b. A current h entering the metal foil piece 15a from the IGBT chip 11b enters the conductive pattern 5a through the metal pins 17. A current i entering the conductive pattern 5a flows out of the N-terminal 22a to an external circuit.

In this current path, the direction of the current a flowing to the conductive pattern 4a and the direction of the current h entering the metal foil piece 15a on the front surface are opposite to each other (section B). The direction of the current b flowing to the metal foil piece 16a on the rear surface and the direction of the current h flowing to the metal foil piece 15a on the front surface are opposite to each other (section C).

In addition, the direction of the current a flowing to the P-terminal 21a and the direction of the current i flowing to the N-terminal 22a are also opposite to each other (section A). Thus, wiring inductances are lowered during the steady operation.

At the time of commutation, however, currents g, h', f, shown in the dotted lines, which flow through the path of the load M—the IGBT chip 11b—the FWD chip 12a—the load M, and the currents a, b, c flowing through the path of the P-terminal 21a—the IGBT chip 9a—the load M are separated from each other and hardly interfere mutually, so a reduction rate of mutual inductance is low.

In the 6-in-1 semiconductor module 200, therefore, wiring inductances thereof can be reduced at the time of the steady operation.

Third Embodiment

Figure 13:
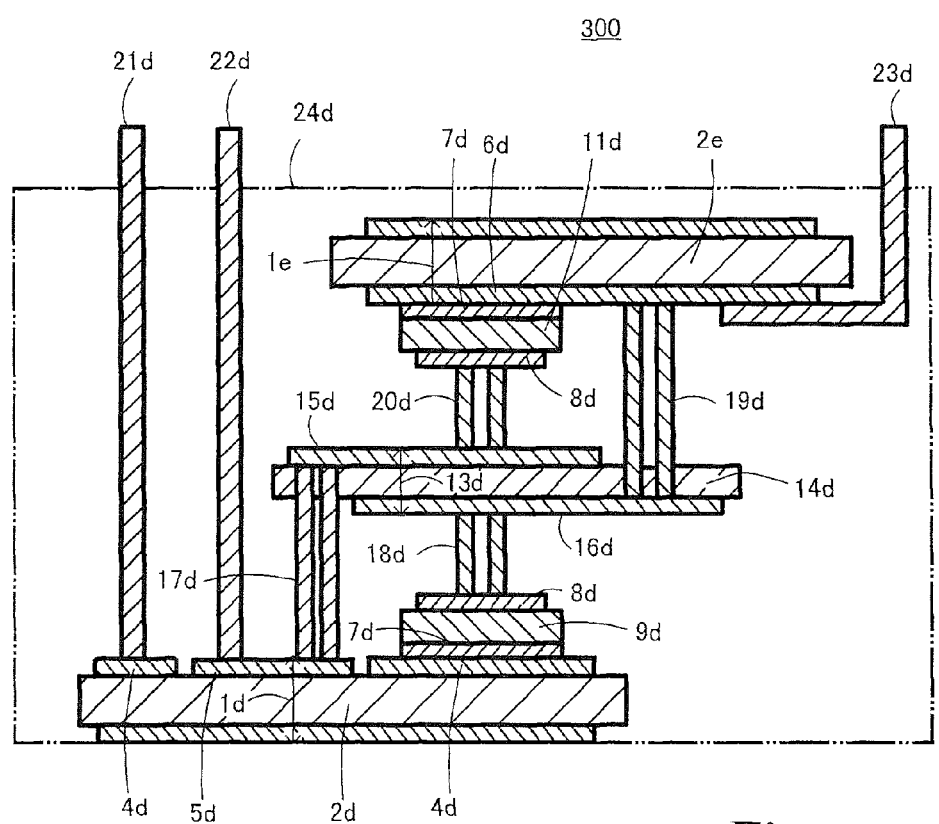
FIG. 13 is a cross-sectional diagram showing substantial parts of a semiconductor device according to a third embodiment of the present invention.

FIG. 13 is a cross-sectional diagram showing substantial parts of a semiconductor device according to a third embodiment of the present invention. This semiconductor device is a 2-in-1 semiconductor module 300. This semiconductor module 300 uses two insulating substrates with conductive patterns (ceramic insulating substrates) 1d, 1e to configure a longitudinal circuit so as to minimize the area of an insulating substrate with metal pins 13d.

The collector of an IGBT chip 9d and the cathode of a FWD chip, not shown, are fixed onto the insulating substrate with conductive patterns 1d by solder 7d.

The collector of an IGBT chip 11d and the cathode of a FWD chip, not shown, are fixed onto the insulating substrate with conductive patterns 1e by the solder 7d.

The printed circuit board with metal pins 13d is formed by joining metal foil pieces 15d, 16d to front and rear surfaces of a ceramic insulating substrate 14d, respectively. Therefore, the metal foil piece 15d on the front surface and the metal foil piece 16d on the rear surface face each other in the printed circuit board with metal pins 13d. Metal pins 17d, 18d, 19d, 20d are fixed and electrically connected to the printed circuit board with metal pins 13d. The metal pins 18d are fixed and electrically connected to the emitter of the IGBT chip 9d and the anode of the FWD chip, not shown, by solder 8d. The metal pins 20d are fixed and electrically connected to the emitter of the IGBT chip 11d and the anode of the FWD chip, not shown, by the solder 8d. The metal pins 17d are fixed to the metal foil piece 15d and penetrate the insulating substrate 14d. The metal pins 19d are fixed to the metal foil piece 16d and penetrate the insulating substrate 14d.

A P-terminal 21d is fixed and electrically connected to a conductive pattern 4d of the insulating substrate with conductive patterns 1d. The metal pins 17d and an N-terminal 22d are fixed and electrically connected to a conductive pattern 5d. The P-terminal 21d and the N-terminal 22d are disposed adjacent to each other in parallel and formed from metal bars (plates). A U-terminal 23d and the metal pins 19d are fixed and electrically connected to a conductive pattern 6d of the insulating substrate with conductive patterns 1e. The conductive pattern 5d is in the shape of an island, surrounded by the conductive pattern 4d.

The insulating substrates with conductive patterns 1d, 1e are disposed, with the printed circuit board with metal pins 13d therebetween. The semiconductor chips (the IGBT chips 9d, 11d and the FWD chips (located behind the IGBT chips 9d, 11d in FIG. 13)) are fixed and electrically connected to the insulating substrates with conductive patterns 1d, 1e. The entire insulating substrates with conductive patterns are sealed with resin 24d, completing the semiconductor module 300.

The structure shown in FIG. 13 results in creating a thick semiconductor module 300 but can significantly reduce the surface area (footprint) of the semiconductor module 300, contributing to the reduction in size of the system incorporating the semiconductor module 300.

In this case, the printed circuit board with metal pins 13 of the first embodiment can be further reduced in size, accomplishing further reduction of wiring inductances of the semiconductor module 300.

Figure 14:
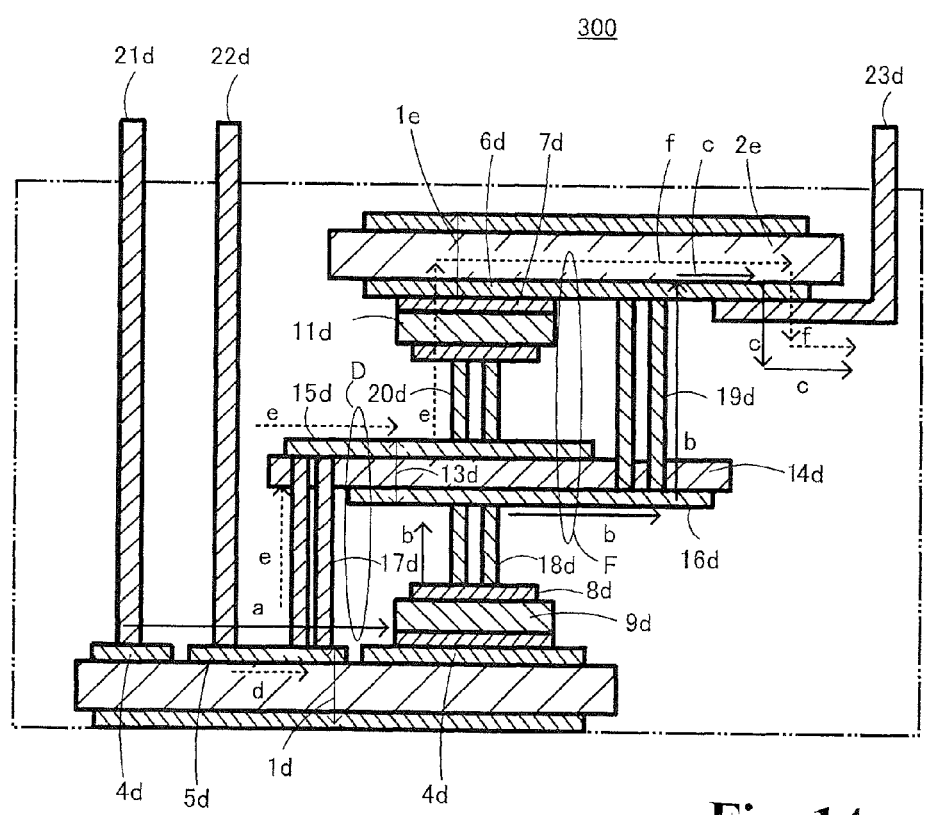
FIG. 14 is a diagram showing paths of currents flowing in the semiconductor device of FIG. 13 at the time of commutation (solid lines) and at other time (dotted lines).

FIG. 14 is a diagram showing paths of currents flowing in the semiconductor device of FIG. 13 at the time of commutation (solid lines) and at other times (dotted lines). A current a entering the P-terminal 21d flows through the conductive pattern 4d of the insulating substrate with conductive patterns 1d to enter the metal pins 18d. A current b that enters the metal foil piece 16d on the rear surface of the printed circuit board with metal pins 13d from the metal pins 18d flows out of the metal pins 19d. A current c that flows out of the metal pins 19d flows to the U-terminal 23d through the conductive pattern 6d.

At the time of commutation, a current d enters the conductive pattern 5d from the N-terminal 22d. A current e that flows from the conductive pattern 5d to the FWD chip (not shown) through the metal pins 17d, the metal foil piece 15d on the front surface, and the metal pins 20d, flows to the conductive pattern 6d. A current f flowing through the conductive pattern 6d flows to the U-terminal 23d.

The current a and the current e face each other and flow in the same direction. The current b and the current f also face each other and flow in the same direction. A voltage that is generated in the conductive pattern 4d as the product of a reduction rate of the current a (−di/dt) and an inductance (L) of the conductive pattern 4d (L·(−di/dt)) is canceled out by a magnetic flux resulting from an increase rate of the current e, and becomes small.

A voltage that is generated in the conductive pattern as the product of a reduction rate of the current b (−di/dt) and an inductance (L) of the metal foil piece 16d (L·(−di/dt)) is canceled out by a magnetic flux resulting from an increase rate of the current f, and becomes small.

Due to the configuration described above in which the conductive pattern 4d and the metal foil piece 15d are disposed close to each other in parallel, as well as the metal foil piece 16d and the conductive pattern 6d, the wiring inductances can be reduced, as well as the voltages that are generated in the conductive patterns 4d, 6d and the metal foil pieces 15d, 16d at the time of commutation.

In other words, such a configuration can suppress a rising voltage (surge voltage) that occurs when the IGBT chip 9d is switched to its OFF state.

The wiring inductances can also be reduced by forming the P-terminal 21d and the N-terminal 22d, which are external lead terminals, from metal bars (plates) and disposing these terminals parallel to each other.

The wiring inductances can also be reduced by shortening the metal pins to reduce the distances from the printed circuit board with metal pins 13d to the conductive patterns 4d, 6d.

The third embodiment describes the 2-in-1 semiconductor module 300, but the structure thereof can be applied to a 4-in-1 and 6-in-1 semiconductor modules as well.

The first to third embodiments illustrate the IGBT chips and the FWD chips as examples of semiconductor elements; however, MOSFET (MOS Field-Effect Transistor) chips, J-FET (Junction Field-Effect Transistor) chips, bipolar transistor chips, or other switching transistor chips may be used in place of the IGBT chips.

Examples of the FWD chips include pn diode chips or Schottky barrier diode chips.

The first embodiment describes the 2-in-1 semiconductor module 100 and the second embodiment describes the 6-in-1 semiconductor module 200; however, the present invention can also be applied to a 4-in-1 semiconductor module in which four semiconductor elements (combinations of IGBT chips and FWD chips) are accommodated in a single package.

Figure 15A:
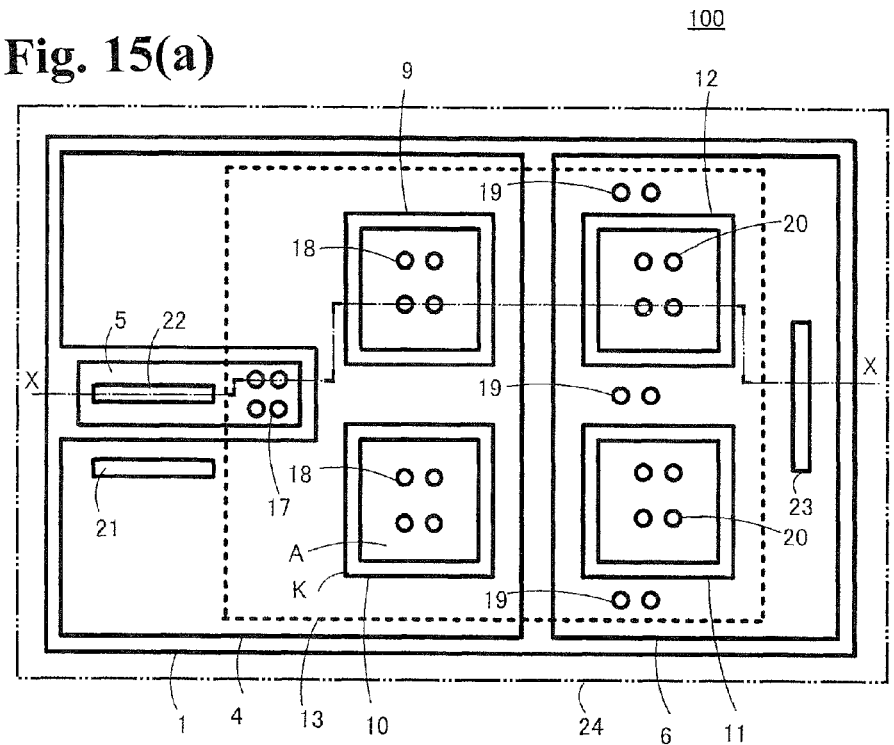
Figure 15B:
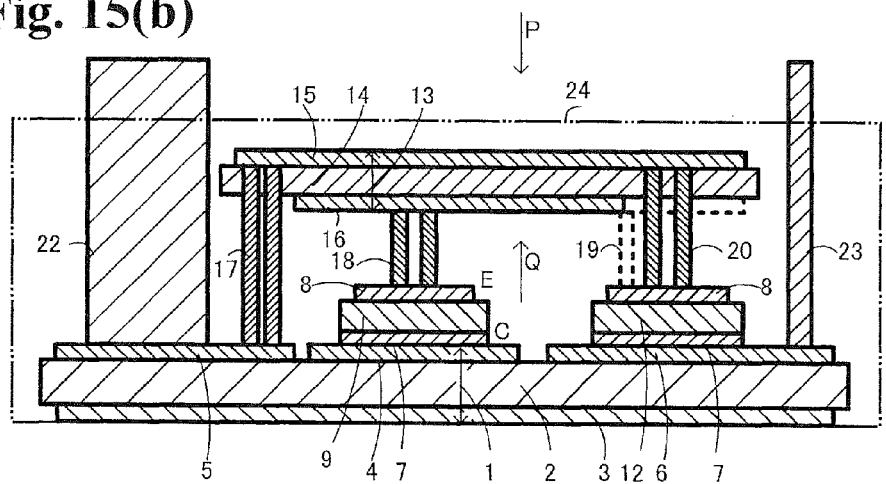
Figure 16:
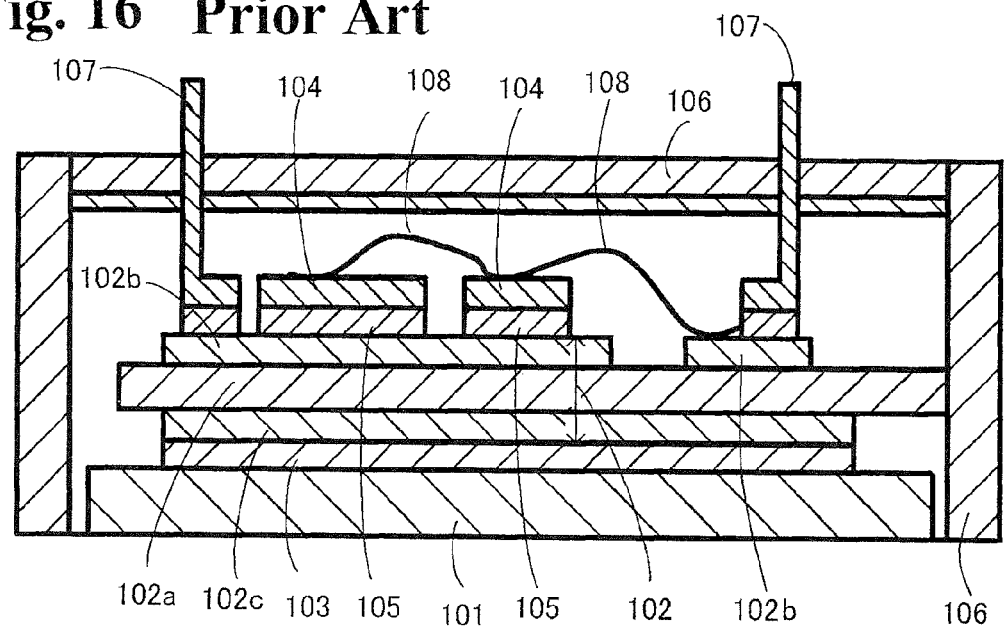
FIG. 16 is a cross-sectional diagram showing substantial parts of a conventional semiconductor device.

In addition, according to the embodiments described above, the conductive patterns 5, 5a, 5d are in the shape of islands, surrounded by the conductive patterns 4, 4a, 4d, respectively. However, the four sides of each of the conductive patterns 5, 5a, 5d do not always have to be surrounded by each of the respective conductive patterns 4, 4a, 4d, and therefore a different configuration can be adopted. For example, as shown in FIG. 15 illustrating a modification of the semiconductor module 100 of the first embodiment, the conductive pattern 4 may be in the shape of a letter "U" so that three sides of the conductive pattern 5 can be surrounded by the conductive pattern 4. Such a configuration in which at least three sides of the conductive pattern 5 are surrounded by the conductive pattern 4 can provide a semiconductor device further reduced in size.

EXPLANATION OF REFERENCE NUMERALS 1, 1a, 1d, 1e Insulating substrate with conductive patterns
2, 2a, 2d, 2e Ceramic substrate (first insulating substrate)
3, 3a Back-face conductive film
4, 4a, 4d Conductive pattern (first conductive pattern)
5, 5a, 5d Conductive pattern (second conductive pattern)
6, 6a, 6b, 6c, 6d Conductive pattern (third conductive pattern)
7, 7a, 7d, 8, 8a, 8d Solder
9, 9a, 9d, 11, 11a, 11d IGBT chip
10, 10a, 12, 12a FWD chip
13, 13a, 13d Printed circuit board with metal pins (insulating substrate with conductive pins)
14, 14a, 14d Insulating substrate (second insulating substrate)
15, 15a, 15d Metal foil piece on front surface (conductive layer)
16, 16a Metal foil piece on rear surface (conductive layer)
17, 17d Metal pin (second conductive pin)
18, 18d Metal pin (first conductive pin)
19, 19d Metal pin (first conductive pin)
20, 20d Metal pin (second conductive pin)
21, 21a, 21d P-terminal (positive-electrode external lead terminal)
22, 22a, 22d N-terminal (negative-electrode external lead terminal)
23, 23a, 23d U-terminal (external lead terminal of intermediate potential)
23b V-terminal
23c W-terminal
24, 24a Epoxy resin
24d Resin
100, 200, 300 Semiconductor module
a to i, r Current

What is claimed is:

1. A semiconductor device, comprising:
a first conductive pattern equipped insulating substrate, having a first conductive pattern on a first insulating substrate;
a first semiconductor element having one surface fixed to the first conductive pattern;
a metal pin equipped printed circuit board, having a conductive layer on a second insulating substrate and a plurality of metal pins fixed to the conductive layer; and
a third insulating substrate;
wherein a portion of the plurality of meal pins constituting the plurality of metal pins is fixed to other surface of the first semiconductor element, and
the metal pin equipped printed circuit board is sandwiched between the first conductive pattern equipped insulating substrate and the third insulating substrate.

2. The semiconductor device according to claim 1, further comprising a third conductive pattern on the third insulating substrate.

3. The semiconductor device according to claim 2, wherein other pins constituting the plurality of metal pins electrically connect between the conductive layer of the metal pin equipped printed circuit board and the third conductive pattern.

4. The semiconductor device according to claim 2, further comprising a second semiconductor element fixed to the third conductive pattern.

5. The semiconductor device according to claim 1, wherein the first conductive pattern equipped insulating substrate, the third insulating substrate, the first semiconductor element, and the metal pin equipped printed circuit board are sealed with a sealing resin.

* * * * *